United States Patent [19]

Roberts et al.

[11] Patent Number: 4,661,997
[45] Date of Patent: Apr. 28, 1987

[54] MIXER FOR USE IN A MICROWAVE SYSTEM

[75] Inventors: Clayton R. Roberts, Syracuse; Stephen J. Nightingale, Liverpool, both of N.Y.

[73] Assignee: Motorola, Inc., Schaumburg, Ill.

[21] Appl. No.: 779,139

[22] Filed: Sep. 23, 1985

[51] Int. Cl.$^4$ .............................................. H04B 1/26
[52] U.S. Cl. .................................... 455/327; 455/328; 455/330
[58] Field of Search .............................. 455/325–328, 455/330

[56] References Cited

U.S. PATENT DOCUMENTS 4,480,336  10/1984  Wong et al. ......................... 455/328
4,553,266  11/1985  Bates et al. ......................... 455/227

OTHER PUBLICATIONS

"Ku-Band Front-End in Integrated Fin-Line Technique" by Begemann et al, 4-1980.

Primary Examiner—Jin F. Ng

[57] ABSTRACT

A novel mixer of good noise performance for operation at microwave frequencies (e.g. the 22 GHz communications band) is disclosed. The mixer comprises a waveguide to which signals and local oscillations are coupled, and from which the intermediate frequency output is derived. The principal circuitry is provided on a metallized substrate set within the waveguide in a "finline" construction. The metallized substrate performs the essential functions of impedance matching the mixer to the source of signal and local oscillations, a bridge for isolating the signal port from local oscillations and for isolating the LO port from the signal, and means to adjust the application of signal and load to the mixer diodes for optimum signal conversion. The noise figure achieved is approximately 4 db at 22 GHz, and represents an improvement over known competitive designs.

12 Claims, 12 Drawing Figures

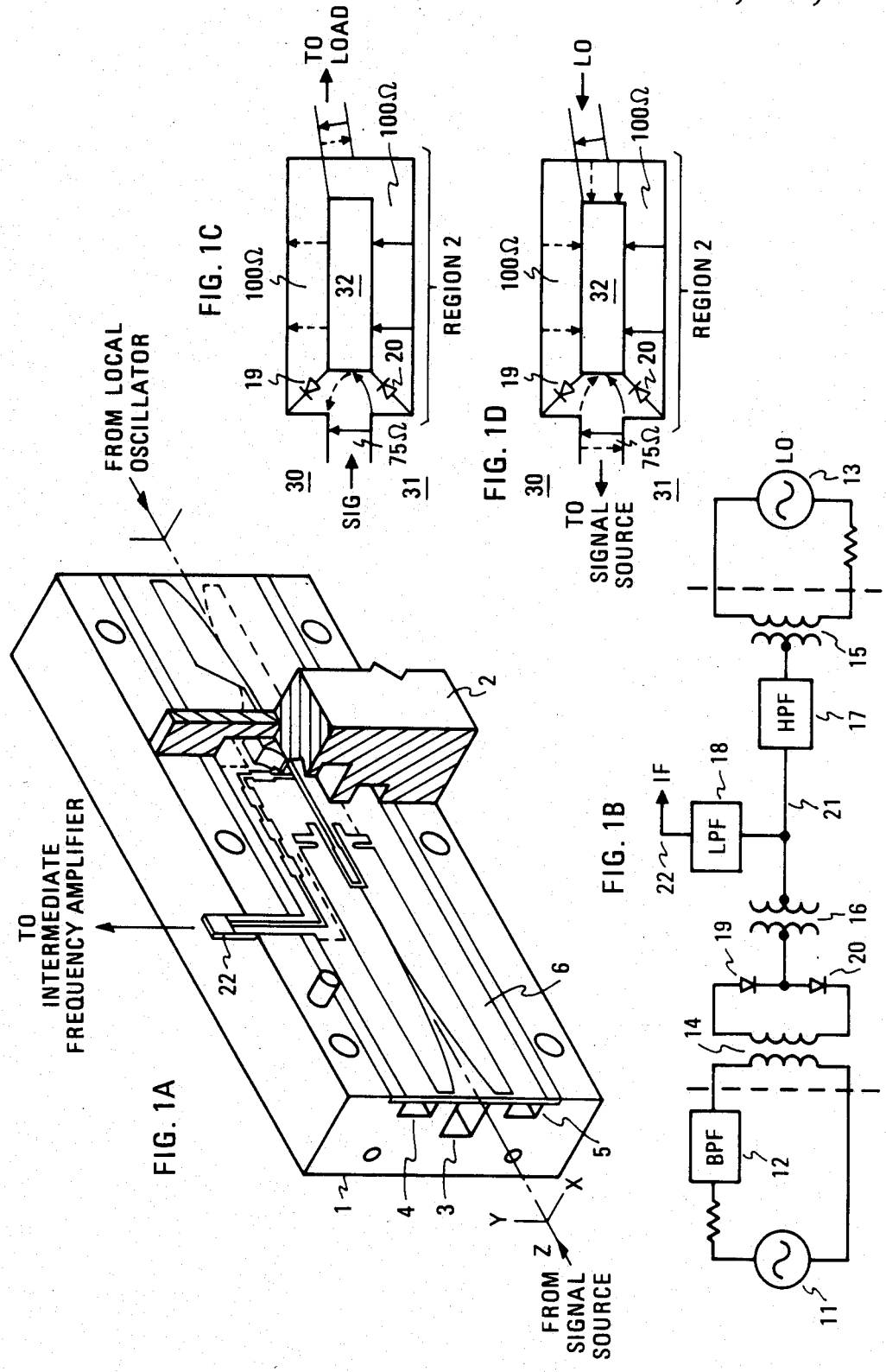

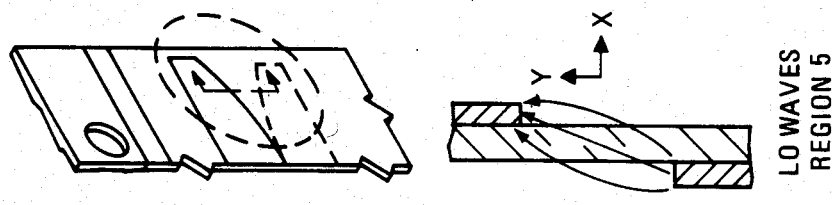
FIG. 1H — LO WAVES REGION 5
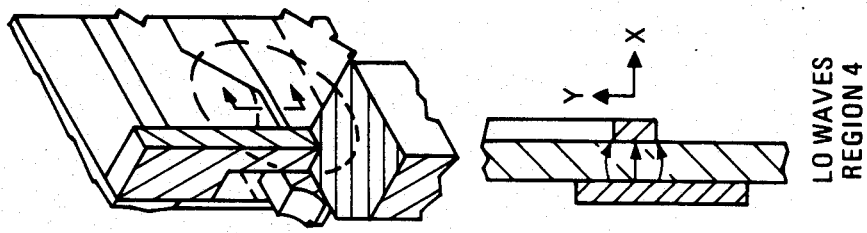
FIG. 1G — LO WAVES REGION 4
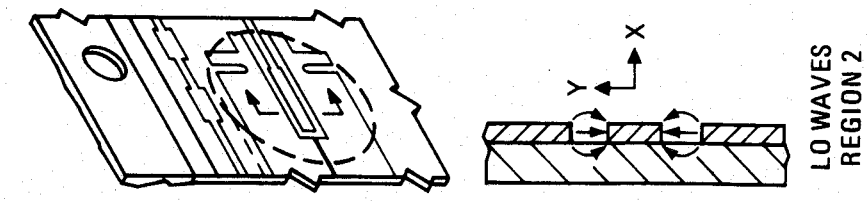
FIG. 1F — LO WAVES REGION 2
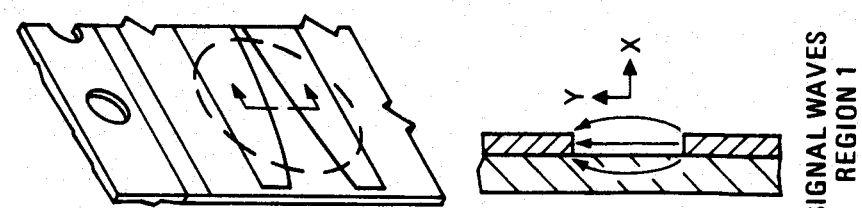
FIG. 1E — SIGNAL WAVES REGION 1

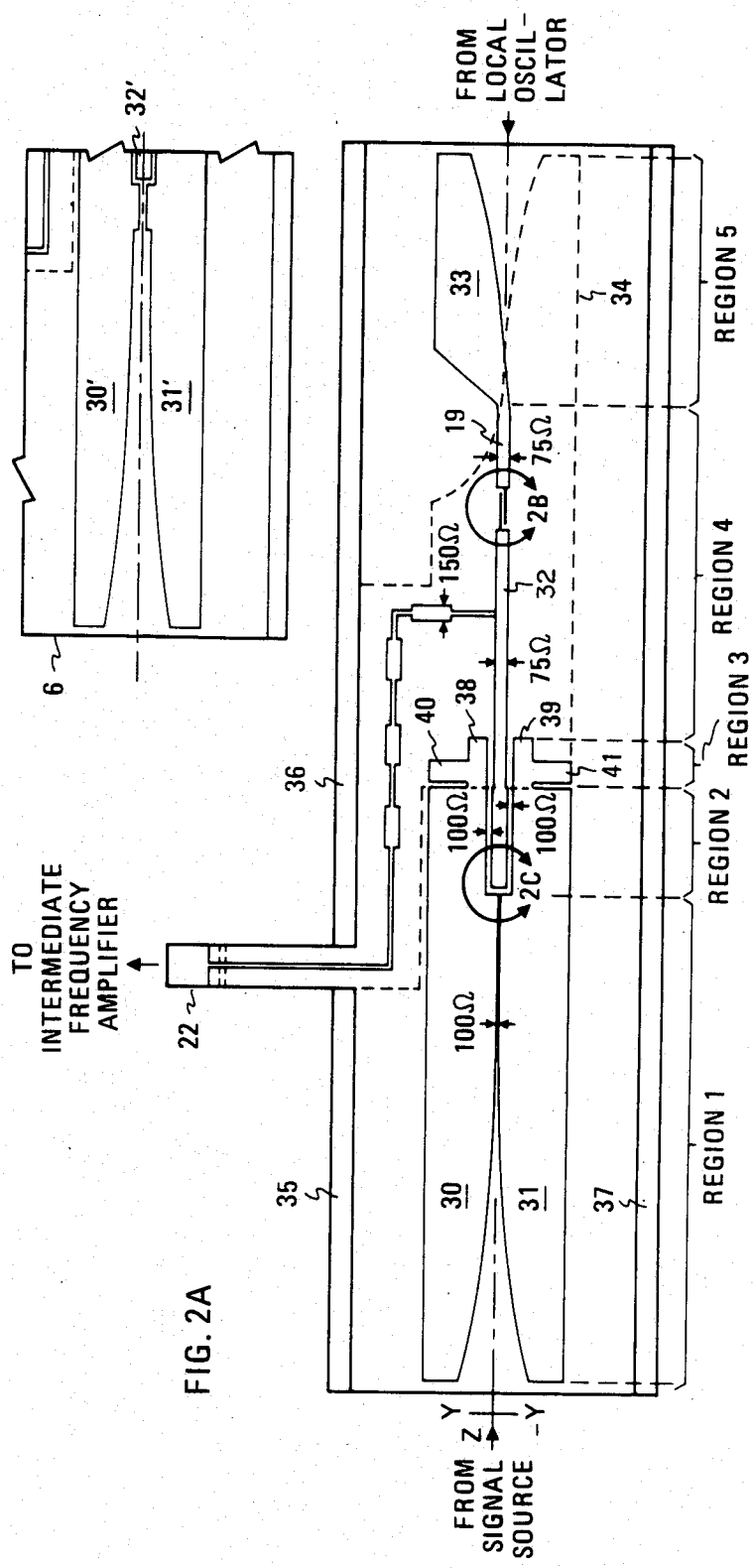
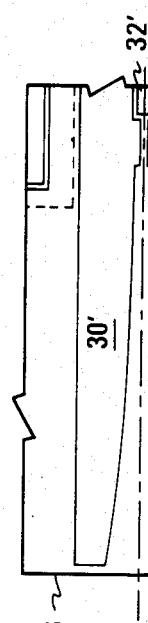
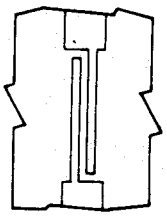

MIXER FOR USE IN A MICROWAVE SYSTEM

BACKGROUND OF THE INVENTION

1. Field of the Invention

The present invention relates to microwave systems, typically communication systems, such as find use in the microwave communications bands, e.g. the 21.2 to 23.6 GHz band. The invention further relates to a novel single balanced mixer for effecting a stable, low cost, conversion to an intermediate frequency suitably low (240 MHz) for convenient amplification. In a mixer operating at these frequencies, efficient transmission paths and efficient filtering must be provided. The disclosed transmission paths include waveguides and a dielectric substrate with metallizations thereon installed within the waveguide in what may be called a "Finline" construction.

2. Description of the Prior Art

In microwave communications to which the invention has application, the conventional system incorporates two transceivers communicating over a microwave link, each transceiver incorporating both a transmitter and a receiver connected to an antenna functioning in both transmission and reception. The system may also take the "Simplex" form in which only a single transmitter and a single receiver are involved.

The receiver in such systems incorporates a mixer as the first active element usually preceded by a low loss band pass filter to remove image frequencies and other interference. The noise figure, a critical parameter of such receivers, is determined primarily by the mixer.

A known mixer having this application is disclosed in the U.S. Pat. No 4,418,429 granted Nov. 29, 1983 to Clayton R. Roberts, and Assigned to the present Assignee. The mixer disclosed in the patent was a single balanced mixer coupled to the signal source and local oscillator with waveguide transmission paths and using microstrip internal transmission paths. In practical embodiments of the patented mixer, typical double sideband noise figures of seven to eight decibels were obtained.

SUMMARY OF THE INVENTION

Accordingly, it is an object of the invention to provide an improved mixer for microwave operation.

It is a further object of the invention to provide an improved single balanced mixer for microwave operation.

It is another object of the invention to provide a mixer for microwave operation having an improved noise figure.

It is still another object of the invention to provide a mixer for microwave operation having improved filtering in the input, output, and internal transmission paths.

It is an additional object of the invention to provide an improved single balanced mixer efficiently coupled externally to waveguides for signal and local oscillator waves and to microstrip lines for the intermediate frequency output.

These and other objects of the invention are achieved in a novel mixer comprising a pair of mixer diodes, a housing for the mixer diodes providing a rectangular waveguide chamber for propagating a wave in a TE 10 mode, and a dielectric substrate, providing the site for the mixer diodes which is disposed in the waveguide for maximum E field interaction.

Microwave signals are coupled to the mixer through a first opening at one end of the waveguide, and local oscillator waves are coupled to the mixer through a second opening at the other end of the waveguide. The intermediate frequency output of the mixer is derived from an intermediate point in the waveguide.

In accordance with the invention, the dielectric substrate has two patterned metallizations, one on one surface and one on the opposite surface, the two metallizations successively providing five consecutive regions for transforming the applied signal and LO waves for efficient mixer operation. Means are provided in a first region for transforming the impedance of the signal waveguide to a first low impedance comparable to that required for mixer operation. Means are provided in a fifth region for transforming the impedance of the oscillator waveguide to a second low impedance comparable to that required for mixer operation and for rotating the E field into perpendicularity to the substrate.

Means are provided in a fourth region for high pass filtering LO waves from the fifth region in the path toward the diode site and blocking IF and DC in the LO path, and for low pass filtering waves of intermediate frequency in a path from the diode site to the mixer output, but blocking LO and signal waves in the IF path.

Means are further provided in a third region for splitting the local oscillator waves in two equal parts for coupling to the diodes and rotating the parts clockwise and counterclockwise until the E fields thereof are parallel to the substrate at the diode site and in a sense favoring alternate diode conduction in successive half cycles.

And finally, means are provided in a second region for splitting the signal waves in two equal parts for coupling to the diodes at the diode site in a sense favoring simultaneous diode conduction in alternating half cycles.

The splitting means in the second region and in the third region, when so connected, form a bridge in which local oscillations coupled to the fourth region are substantially cancelled in passage to the first region and signal waves coupled to the first region are substantially cancelled in passage to the fourth region.

More particularly, these cancellations are achieved by making the two paths between the splitting means of equal electrical length and by providing that the splitting means in the third region invert the sense of the signal in one path in relation to the signal in the other path.

In accordance with another aspect of the invention, the third region is provided with at least one pair of matching stubs for matching the impedance of the fourth region to the second region. More particularly, two pairs of matching stubs are provided, the pair adjacent the second region being slotted for decoupling from the top metallization of the second region. The electrical length between the slot and the diode site is then made to be substantially equal to 180 electrical degrees at the signal frequency for improved impedance matching and for tuning the mixer diodes for improved conversion efficiency.

BRIEF DESCRIPTION OF THE DRAWINGS

The novel and distinctive features of the invention are set forth in the claims of the present application. The invention itself, however, together with further objects and advantages thereof, may best be understood by reference to the following description and accompanying drawings in which:

FIGS 1A and 1B illustrate a novel mixer in accordance with the present invention; FIG 1A being a cutaway perspective view of the novel mixer illustrating the housing providing a rectangular waveguide chamber and a planar dielectric substrate with patterned conductors on its major surfaces established as a finline within the waveguide, five separate regions of the finline providing the mixing function; FIG. 1B being an equivalent circuit representation of the novel mixer; FIG. 1C and 1D being simplified representations of region 2, whose signal and LO cancellation occurs in the mixer; and FIGS. 1E-1H being expanded perspective and cross sectional views designed to illustrate the E field orientations in the respective regions;

FIGS. 2A, 2B, and 2C are detailed plan views of the patterned dielectric substrate; FIG. 2A illustrating the patterning in the five regions of the mixer; FIG. 2B being an enlarged view of the high pass filter designed to pass local oscillator waves to the mixer diodes and to prevent passage of intermediate frequency signals to the local oscillator; and FIG. 2C being an enlarged view of the diode mixer site on the dielectric substrate; and FIG. 3 is a plan view of an alternative embodiment in which the metallization in the first region in the input signal path to the mixer is modified for improved manufacturability.

DESCRIPTION OF THE PREFERRED EMBODIMENTS

Referring now to FIGS. 1A and 1B primarily, there is shown a novel single balanced mixer incorporating the invention and suitable for operation in the 22 GHz communications band. The mixer has a first opening of a waveguide 3 in the near left end of the mixer housing (1, 2) designed to be connected to a signal source 11 by means of a first flanged waveguide coupling (not shown) and a second opening (not shown) of the same waveguide in the far right end of the mixer designed to be connected to a local oscillator 13 by means of a second flanged waveguide coupling (not shown). The signal and LO waves are of comparable frequency producing a lower intermediate frequency of 240 MHz (for example). The intermediate frequency output of the mixer is coupled via a microstrip line 22 to an intermediate frequency amplifier (not shown).

In FIG. 1B, which is an equivalent circuit representation of both external and internal circuitry of the mixer, the external circuitry is represented by four lumped elements, the signal source 11, the band pass filter 12, the local oscillator 13, and the IF output 22, and the internal circuitry is represented by seven lumped elements consisting of three transformers 14, 15, 16, two filters 17 and 18, and two mixer diodes 19 and 20.

The mixer circuit, continuing with reference to FIG. 1B, is a single balanced mixer having a carefully matched, low noise design. The signal, typically in the 22 GHz communications band is coupled via the band pass filter 12, which is set to pass waves of signal frequency and to reject waves of image frequency from the signal input of the mixer. The mixer signal input is equivalently represented as the transformer 14 for efficiently coupling the signals arriving via a waveguide to the lower impedance mixer diodes 19 and 20. Local oscillations offset from the signal frequency by the IF frequency of 240 MegaHertz are provided by the LO source 13 over waveguide to the LO input of the mixer.

The mixer LO input is equivalently represented as the transformer 15 for matching the waveguide to the microstrip 21. The local oscillations from the microstrip 21, are next coupled via the high pass filter 17 to a second section of the microstrip line 21, which is in turn coupled via a third matching transformer 16 to the mixer diodes 19 and 20. The high pass filter 17 permits passage of local oscillations from 13 to the mixer diodes for production of the intermediate frequency heterodyne. The filter 17 blocks the passage of intermediate frequency waves back into the local oscillator (13B). The transformer 16 between the second section of the microstrip line 21 and the mixer diodes 19, 20 aids in matching the impedance of the microstrip line to the impedance of the mixer diodes. Finally, the heterodyne product at the intermediate frquency is coupled from the mixer diodes 19, 20 via the transformer 16 to the second section of the microstrip line 21 and thence via the low pass filter 18 to the intermediate frequency output microstrip line 22.

The lumped equivalent circuit representation of the mixer is simplified in that it does not represent the underlying E field distributions and the field rotations that take place, while it does in a general way describe the radio frequency paths through the mixer and the impedance matching measures. These omitted features will be taken up in greater detail below, as the physical construction of the waveguide, and the finline set therein which performs these functions, are described.

As illustrated in FIG. 1 A, the mixer consists of a pair of conductive housing members 1 and 2, of similar rectangular outline when depicted in a front elevation view. When the members 1 and 2 are fitted together, they form a straight central rectangular waveguide chamber 3, flanked above and below by two narrow slots opening into two straight rectangular choke chambers 4 and 5, respectively which are displaced above and below the waveguide chamber in the Y-direction by quarter wavelengths at signal frequencies. The three chambers 3, 4, and 5 are aligned parallel to the top and bottom surfaces of the rectangular housing and are terminated at the left and right end surfaces of the housing members 1 and 2 in approximately rectangular openings. As noted earlier, the openings of the waveguide 3 allow for flanged connections to the waveguides providing signal and local oscillations to the mixer.

For purposes of orientation in FIG. 1A, a Z axis is projected entering the center of the left waveguide opening and exiting at the center of the right waveguide opening. The Y axis of the waveguide is the vertical axis defining with the Z axis the vertical plane in the perspective representation of FIG 1A and X axis of the waveguide is the horizontal axis defining with the Z axis the horizontal plane in the FIG. 1A representation. The waveguide thus propagates waves at signal and LO frequencies in the TE10 mode along the Z axis with the E field vectors parallel to the vertical (Y) axis. The chokes 4 and 5 also are continuous passges terminating in openings at the left and right ends of the housing. These passages are dimensioned to "choke" and not propagate waves at signal and LO frequencies, and the openings at the ends are closed when the waveguide flanges are assembled upon the housings.

Continuing with mechanical details of the mixer, the housing member 1 is provided with a shallow depression on the surface facing the other housing member (2). The depression extends from the left end to the right end of the housing member, and extends upwardly from the (Z) axis a short distance above and downwardly from the Z axis a short distance below the chokes 4 and 5. The depression has a depth equal to the thickness of the substrate 6, in order to allow the two members to close tightly about it. When the housing members are closed upon it, the substrate 6 is constrained to lie in a vertical plane with the back surface slightly displaced from the central vertical (Y Z) plane and the front surface coincident with the central vertical (Y Z) plane of the waveguide. The metallizations on the front surface and on the back surface of the substrate are relatively thin, and although not precisely central, they lie in the waveguide in a position where the E field is of greatest intensity. This construction is called a finline construction. It provides a low loss mechanism for transferring the energy propagating in the connecting waveguides in the TE10 mode to propagation confined within the waveguide 3 to a smaller region defined between the nearest adjacent surfaces and edges of the metallizations on the substrate.

The finline metallizations which propagate the RF fields, rotate the field orientations, and form impedance transformers in five successive regions spaced along the Z axis of the mixer are best seen in FIG. 2A.

The finline comprises three "sealing" and five "active" metallizations 30-37 formed on the substrate 6. The sealing metallizations (35-36) and 37 are provided respectively at the upper and lower margins of the front surface of the substrate 6 where they enter slots defined by the housing members 1 and 2 in the uppermost and lowermost walls of the chokes 4 and 5. The substrate and sealing metallizations 35-37 are set in recesses in the housing member 1 and are in electrical contact with the mating surface of housing member 2. The arrangement provides a good RF seal at the outer margin of the chokes reducing the amount of RF energy escaping through any cracks existing between the housing members 1 and 2.

The four active metallizations 30, 31, 32 and 33 on the top surface of the substrate and the one active metallization (34) on the bottom surface of the substrate, have uppermost and lowermost margins which extend beyond the waveguide chambers and further improve the RF seal around the waveguide proper. In regions 1 and 2 and part of region 3, the uppermost and lowermost margins of the top surface metallizations 30 and 31 extend through the slotted region defined between the waveguide 3 and the adjacent chokes 4 and 5. In region 5, the uppermost margin of the top surface metallization 33 extends through the slotted region defined between the waveguide 3 and the adjacent chokes 4 and 5. In regions 3 and 4 the upper margin of the lower surface metallization 34 and in regions 3, 4 and 5 the lower margin of the lower surface metallization 34 extends through the slotted region defined between the waveguide cavity and the upper and lower chokes, respectively. These extensions of the metallizations past the waveguide chambers approximate a quarter wave length (of waves propagated in the dielectric substrate) in length to form a low impedance path across the slot for minimum leakage of RF energy out of the waveguide. The chokes are also approximately a quarter wavelength in length and thus present the high impedance desired to inhibit further RF leakage from the waveguide into the chokes.

The portions of the metallizations extending into the cavity of the waveguide 3 are "active" in performing the sundry electrical functions noted earlier. (In addition, portions of the metallization 32 which exit the waveguide cavity in a special opening in the waveguide wall and which cooperate with portions of the bottom surface metallization 34 are "active" in forming the IF tap which will be separately discussed.) The electrical functions of the five regions of the finline will now be considered region by region.

In region 1, where signal waves enter the mixer, the metallizations 30 and 31 which are disposed adjacent one another above and below the Z axis, form the impedance transformer 14 of FIG. 1B between the waveguide opening and the diode site. The metallizations 30 and 31 extend along the Z axis from just inside the left opening of the waveguide through region 1 (and incidentally 2 and 3). In region 1 (and 2) there is no underlying metallization. In region 1, the portions of the top surface metallizations 30, 31, which extend into the waveguide 3, form a tapered coplanar slotline tapering from the full width of the waveguide to a few thousands of an inch. As the signal waves progress from the left to right along the Z axis, the fields within the waveguide, stronger in the center of the waveguide and oriented in the same vertical direction as the slot, concentrate to an ever increasing degree in the slot as the slot narrows. The tapered slot provides a very smooth, reflection-free match between the waveguide impedance which is 491 ohms near the opening and the much lower impedance (75 ohms) required for an approximate match to the mixer diodes at the diode site. The E field orientation in the tapered slot in region 1 is vertical (parallel to the Y axis) as illustrated in FIG. 1E.

In region 5, where LO waves enter the mixer, the top surface metallization 33 and the bottom surface metallization 34 form a non-coplanar slot which may also be referred to as an antipodal line, which is transformed to a modified microstrip at the boundry with region 4. In the process they form the impedance transformer 21 of FIG. 1B between the waveguide opening and the microstrip 21, and at the same time provide a 90 degree rotation of the E field vector. As shown in FIG. 2A, the top surface metallization 33 and the bottom surface metallization 34 are initially disposed adjacent one another above and below the Z axis near the right waveguide opening. However, the metallizations begin to overlap as they approach region 4. The two metallizations extend along the Z axis from just inside the right opening of the waveguide through region 5 (and into region 4). In region 5, the portions of the top surface metallization 33 and the portions of the bottom surface metallization 34, which extend into the opening of the waveguide 3, form a tapered (non-coplanar) slot line. The slot line tapers from the full width of the waveguide at the right opening to the point where the metallizations overlap near region 4. Viewed in the plan view of FIG. 2A, the slot opening is extinguished at the point where the metallizations intersect and reemerges as a negative value as the two metallizations overlap. Viewed in a plane orthogonal to FIG. 2A, the metallizations 33 and 34 remain spaced apart by the thickness of the intervening dielectric substrate 6.

The impedance transformation takes place in the non-coplanar slot formed by metallizations 33, 34 in much the same manner as in region 1. At the right opening, the metallizations, although not precisely coplanar are substantially so and as the local oscillation waves progress from right to left along the Z axis the fields within the LO waveguide, stronger in the center of the waveguide and oriented in substantially the same vertical direction as the non-coplanar slot, concentrate to an ever increasing degree as the slot narrows. Disregarding for the moment the rotation of the E field vector which is taking place, the concentration of the field continues as the gap between the metallizations narrows to the point where the metallizations are separated by only the thicknesss of the substrate 6. As the top metallization 33 commences the overlap, with bottom metallization 34, approaching a microstrip line configuration an impedance of 75 ohms is sought. This is produced by narrowing the metallization 33 toward region 4. At the same time, a gradual widening of the bottom metallization (without increasing the impedance) is permissible preparatory to its becoming a ground plane in regions 3 and 4.

The E field orientation in the non-coplanar slot in region 5 near the right waveguide opening is substantially vertical (parallel to the Y axis) as illustrated in FIG. 1H. Towards region 4, the E field orientation is rotated slightly less than 90 degrees, as the metallization edges and surfaces by which the field is focused approach each other in the Y dimension, and then complete the Y dimension overlap. When the overlap is complete (near the boundary with region 4), the nearest adjacent surfaces are horizontally disposed from one another and the E field which they define is substantially horizontal (parallel to the X axis) as illustrated in FIG. 1G.

In region 4 the LO waves from region 5 propagate along the microstrip line formed between the narrowed top metallization (33 or 32) and the increasingly widened bottom metallization 34 forming a ground plane via a high pass filter toward region 3 and the diode site. (The microstrip line is that element bearing the reference numeral 21 in FIG. 1B.). The top metallization 33, upon leaving region 5 continues to the left for a short distance into region 4, at which point it forms the high pass filter (element 17 in FIG. 1B) with a second top surface metallization 32 proceeding to the right from the diode site in region 2. The high pass filter is formed between two quarter wave stubs, which are narrowed extensions of the metallizations 32 and 33, arranged adjacent one another along the Z axis. The metallizations are formed over the ground plane 34 and are designed to pass local oscillator waves toward the diode site while blocking intermediate frequency waves from entering region 5 and exiting at the waveguide opening into which local oscillators are coupled. The narrow quarter wave extensions of metallizations 32 and 33 are mutually spaced from one another and thus block the passage of any DC current. The high pass filter so formed is impedance matched to the two sections of the microstrip, and the quarter wave dimensioning tends to pass the waves near resonance, in the well known manner.

Continuing to the left beyond the high pass filter 17, the local oscillator energy proceeds past a tap provided for the extraction of intermediate frequency waves. The operation of the tap will be deferred until the IF signals are discussed. Still continuing to the left past the IF tap, the local oscillations proceed along the second portion of the microstrip line 21. In the second portion the microstrip line retains a conventional form in which the narrow top surface metallization 32 is now relatively narrow and the ground plane bottom metallization 34 is substantially infinite in extent. The two metallizations spaced by the substrate, are dimensioned to exhibit an impedance of 75 ohms. This condition continues until the local oscillations reach region 3.

In region 3, the local oscillations (still proceeding to the left toward the diode site) encounter a stepped impedance transformation in which a "T" junction occurs, separating the E fields in the microstrip parallel to the X axis into two parts, and rotating the E fields of the two parts in opposite directions (CW and CCW) into an orientation parallel to the Y axis.

The impedance transformation, the branching at the "T" junction, and the rotation of the E fields are achieved by portions of the top surface metallizations 30–31, and 32 and the bottom surface metallization 34. At the right end of region 3, local oscillator waves proceeding to the left in a microstrip mode propagated by the narrow top surface metallization 32 and the broad bottom surface metallization 34 encounter a pair of quarter wave stubs 38–39, disposed adjacent the narrow metallization 32 so as to form a coplanar slot displaced in the Y dimension below and in the Y dimension above the central metallization. The stubs are a quarter wave length in length at the local oscillator frequency and are relatively wide to achieve a broadband effect. Their presence in proximity to the top metallization 32 is to cause a diversion of the field which had previously been confined between the top and bottom metallizations into the two slots now formed between the stub 38 and metallization 32 and stub 39 and metallization 32. The effect of the two slots is to cause a three-way split of the field between metallization 32 and the three metallizations (38, 39, 34).

As the local oscillations proceed further to the left, they encounter a second pair of quarter wave stubs 40, 41 which are also relatively thick for achieving a broadband effect. These stubs share the metallization with stubs 38, 39 and are oriented perpendicular to these stubs. These stubs are contiguous to the metallization 30, 31 in region 2, but are decoupled therefrom by two deep cuts at the leftmost limit of the stubs 40, 41. At this leftmost point, the underlying metallization 34 is discontinued and the E fields of waves propagating further to the left are constrained to forego an orientation out of the plane of the substrate and are confined to the two coplanar slots which continue at the boundary with region 2. The initial stubs 38, 39 are primarily responsible for initiating the clockwise and counter-clockwise field rotations which is complete when the metallization 34 terminates. The stubs 40, 41 are primarily responsible for smoothing the change in impedance between 75 ohms and the two 100 ohm slots which exist at the interface between region 3 and region 2.

The second region which has now been approached from the left by signal waves leaving region 1 and from the right by local oscillations leaving region 3 provides the site for the mixer diodes and the mechanism for creation of the intermediate frequency signal. The metallizations in the second and third region may be regarded as forming a bridge (or magic "T"). The network so formed uses two "ports", so arranged that signal waves admitted to the first port (at the boundary with the first region) are cancelled at the second port (at the boundary with the fourth region) and local oscillator waves admitted at the second port (at the boundary with the fourth region) are cancelled at the first port (at the boundary with the first region), these cancellations being attributes of a bridge.

As signal waves proceed to the right along the slot formed between metallizations 30, 31 in region 1, they encounter a "T" junction in which what had previously been a single Z directed coplanar slot branches in a plus Y and in a minus Y direction to form two coplanar slots defined respectively between metallization 30 and 32 and 31 and 32. The vertical branches, as illustrated in FIG. 2C, provide the site for the mixer diodes 19 and 20. The two Y directed vertical branched slots are then turned to a Z directed orientation and continue as a pair of coplanar slots still defined between metallizations 30 and 32 and 31 and 32. These two slots of region 2 then transition (with a stepped decrease in width in conductor 32) to the slots in region 3 defined between the matching stubs 37–40 and metallization 32. As earlier noted, the transition at the boundary of region 2 and region 3 also includes the commencement of underlying conductor 34, and the commencement of CW and CCW rotation of the Y directed E fields into an X direction. The electrical length of both paths from the "T" junction to the region 3 boundary are like, and equal to 180 electrical degrees at the signal frequency, a choice which, as will be explained enhances mixer operation.

The local oscillations proceeding to the left from the double coplanar slot provided between the matching stubs 38–41, the metallization 32, and the ground plane 34 in region 3, enter region 2 from the right (where the ground plane terminates). At the same position, the dimensions of the central conductor 32 widen for continuity in the impedance. The characteristic impedances in the two slots in region 2 are approximately 100 ohms. The electrical lengths of both paths through region 2 are alike. This choice, as will be explained, also enhances mixer operation.

The production of the intermediate frequency signal from the heterodyne product resulting from mixing the signal with local oscillations takes place in the diodes 19 and 20 which are disposed near the boundary between region 1 and 2, as best illustrated in FIG. 2C. As illustrated in FIG. 2C, the diode 19 is arranged across the upper branch of the "T" slot and the mixer diode 20 is arranged across the lower branch of the "T" slot. This is achieved by connecting the cathode of diode 19 to metallization 30, the anode of diode 19 and cathode of diode 20 to metallization 32 and the anode of diode 20 to metallization 31. This arrangement, in view of the smallness of the dimensions, places the splitting means (the "T" slot) and the diode pairs at substantially the same electrical distance from the splitting means in the third region.

The relationships of the mixer diodes in the region 3 circuit to the signal and to the local oscillations are illustrated in the equivalent representation of FIG. 1B, and in the E field representations of the slots in FIGS. 1C and 1D. As implied in FIG. 1B, from the point of view of the signal (alone) both diodes would conduct together when the input signal is of one polarity, and both would be non-conductive together when the input signal is of the opposite polarity if the input signal were of adequate strength. As also implied from FIG. 1B, from the point of view of the local oscillations (alone), one diode is conductive when the local oscillations are of one polarity, and the other diode is conductive when the local oscillations are of the opposite polarity assuming adequate strength of the local oscillator. In actual operation, both waves are present and the signal is of a relatively low level, while the local oscillations are of a sufficiently high level to effectively switch the diodes ON and OFF.

The region 2, region 3 portions of the finline operate as a bridge in which cancellations of both oscillator waves at the signal input and signal waves at the oscillator input take place, resulting in enhanced mixer operation. This may be explained by reference to FIGS. 1C ad 1D which illustrate the E field propagation in regions 2 and 3. In FIGS. 1C, the signal is shown propagating from region 1 in the slot defined between metallizations 30 and 31 toward the "T" junction which defines the beginning of region 2. The signal E field is assumed to be representable by an arrow pointing upwards which enters the "T" junction in the region 2. At the "T" junction the field branches into the upper slot where the arrow entering the upper branch is illustrated dotted and the arrow entering the lower branch is illustrated as a solid line. In both branches the arrows point up. In region 3 where a twin line is used to equivalently represent the consolidated output from the two slots, the E fields are combined in opposition and cancellation occurs at the output connection. This cancellation is good to approximately 30 db even assuming that the diodes are in differing conductive states under the influence of the local oscillator. The signal cancellation at the output of region 3 is one benefit from the mixer design.

Another benefit from the design, and in particular the selection of the path length of the two branches to be 180 electrical degrees is the improvement of the match of the mixer diodes to the slot supplying signal to the diodes for enhanced conversion efficiency. The signal is coupled via the 75 ohm slot to the individual diodes installed in two slots each of approximately 100 ohms characteristic impedance.

The output load of the mixer circuit is the microstrip line (region 4), which has a characteristic impedance of 75 ohms. The diodes, under the loading of the microstrip line, might present an unduly low impedance to the signal waves and by a reflection causing mismatch or by shunting the signal around the diodes reduce the conversion efficiency. This is avoided by use of an IF filter of high impedance at the signal frequency, (but molded to the intermediate frequency) and the bridge arrangement in which the 75 ohm load appearing at the output of region 2 is transferred to each diode so as to increase the virtual diode impedance to approximately 100 ohms, a value which matches the slot impedance and reduces reflections. The equivalent diode circuit may be represented as a circuit consisting of the series resistance, series capacitance and the ideal diode, all shunted by a capacitance. The branched slots, having an electrical length of 180 degrees, effectively transform the complex partially capacitive load, presented by the microstrip in regions 3 and 4 by a sign inversion forming a partially inductive load, which increases rather than reduces the effective diode impedance. (If the electrical length of region 2 had been 90 degrees and the impedance of the load at the transition to region 3 resistive then the contribution of the load of the diode site would have been about 48 ohms in shunt with the diode. This would have presented a mismatch to the signals and would have diverted significant signal current from the mixer diodes, greatly reducing the conversion efficiency.)

In the present example, where the electrical lengths of two branches are 180 degrees and the impedance of the load at the transition to region 3 partly resistive and partly capacitive, the contribution of the load at the diode site may be set to be around 100 ohms (partly inductive) in shunt with the diode for a close match to the signal source. This has a second effect of tuning the signal across the diode, thereby increasing the signal current in the diode and increasing the conversion efficiency. The match of the diodes to the region 1 slot delivering the signal is thus improved, signal current is not diverted into the shunting impedances and the signal conversion efficiency is enhanced. The improvement from this optimization is approximately 3 to 4 decibels.

A further benefit resulting from the design is the reduction of radiation from the local oscillator into the detector input circuit. This is best illustrated in FIG. 1D, using the same conventions used in FIG. 1C. Here, however, the circuit is considered from the view point of the local oscillations. Here, the LO waves are coupled from region 4 into regions 2 and 3 where they propagate in the separate branches with the dotted and solid arrows pointing to the central conductor 32. (At the diodes 19, 20, one diode will conduct, and the other will not for a given LO polarity). At the slot at the region 1 boundary the LO waves, will be out of phase and will tend to cancel. The cancellation, as before, will tend to depend on the state of the diodes and on their mode of operation. In practice, the cancellation is approximately 30 db. Since the local oscillator operates at relatively high power, good cancellation is important to avoid radiation via the customary antenna circuitry.

The intermediate frequency signal which is produced at the mixer diodes 19 and 20 appears in the branches of the "T" junction and proceeds to the right via the double coplanar slot, through the double stubs 38-41 to the microstrip formed between the narrow metallization 32 and the ground plane 34 to the IF tap. The IF tap is also a microstrip disposed over the ground plane 34 and includes a series of four quarter wave filter sections of alternately high and low characteristic impedances which presents an impedance of approximately 200 ohms to waves at the signal and local oscillator frequencies. The arrangement provides in excess of 25 db rejection of waves at signal and local oscillator frequencies and acts as a low loss (less than 0.06 db) for low pass filter passing the 240 megahertz intermediate frequency signal to the output 22. The IF output appears at the pad 22 where it may be coupled by a flying lead or other simple means to the input of a pre-IF amplifier.

The finline mixer so far described is designed for minimum expense and is suitable for conventional manufacture. The critical performance factor is that the double sideband noise figure be under 5 db in the communication band of 21.2 to 23.6 GHz. The construction when operating in the reception mode suppresses radiation by the local oscillator. The local oscillator power required to operate the detector is about 18-20 dbm but this is dependent upon the diodes used as well as whether a dc bias is used.

The finline mixer is designed to function with a low loss, band pass filter arranged between the mixer and an antenna and with a preamplifier immediately adjacent to the mixer. The finline construction, in which a substrate is set within the waveguide in the E plane, is possibly slightly more expensive than a microstrip (not set in a waveguide) but the construction has a measured 3-4 db improvement in loss over the other configuration. Only two components need to be added to the substrate which offsets some of the costs when compared to a straight microstrip mixer.

In a practical mixer used in the 22 GHz communications band, the substrate is of 20 mil material having a dielectric constant of 2.17, the waveguide is WR 42 having a rectangular opening of 0.170×0.42". The chokes are 0.17×0.21" and are spaced a quarter wavelength from the waveguides. The construction achieves 70-80 db of isolation shielding.

The diodes are preferably beam leaded GaAs diodes. The package (174-01) is such that the epoxy container just fits across the 0.012" slot. The series diode impedance is 5 ohms or less for reduced conversion loss. The local oscillator power requirements may be further reduced by isolating the metallizations 30 and 31 and using a controlled DC bias across the diodes 17 and 20 to optimize conversion efficiencies.

The design of the first region of the finline is critical to achieving minimum signal loss. The design approach illustrated in FIG. 2A provides a taper (in region 1) which continues for 2½ waves to match the waveguide impedance at about 491 ohms to the impedance at the input junction of the coplanar line (75 minus J23 ohms) with the diodes activated. The design width of the slot near the diode site should be approximately 1.5 mils, but the design may be harder to reproduce under some circumstances. An alternate approach which avoids the problem of reproducing a slot of these small dimensions is illustrated in FIG. 3. In FIG. 3, the taper continues to a 50 mil slot and is then reduced to a 10 mil slot that is a quarter wavelength long with a 115 ohm characteristic impedance. The impedance match may then be optimized with some loss in band width. The average noise figure for the FIG. 3 arrangement of 3.8 db is slightly better than that of the FIG. 2A arrangement.

What is claimed is:
1. A mixer comprising:
   A. a pair of mixer diodes,
   B. a member housing said mixer diodes, and providing a rectangular waveguide chamber suitable for propagating a wave in a TE 10 mode and having axis extending in the Z dimensions, the E field of said TE 10 mode having a Y axis orientation, parallel to the shorter waveguide dimensions, the X axis being parallel to the longer waveguide dimension and transverse to the Y and Z axis, said waveguide having
      (1) a first opening at one end for coupling to a waveguide supplying signal waves to said mixer,
      (2) a second opening at the other end for coupling to a waveguide supplying local oscillator waves to said mixer, and
      (3) a third opening in a lateral wall for said member, for coupling the mixer output to an intermediate frequency amplifier;
   C. a dielectric substrate, providing a site for said mixer diodes, said substrate lying substantially in the Y Z plane of said waveguide and having a first patterned metallization on one surface thereof and a second patterned metallization on the opposite surface thereof, said metallization successively providing first, second, third, fourth, and fifth consecutive region in which:
      (1) said first metalllization in said first region between said first opening and said diode site provides a planar tapered slot for coupling to said E field and is dimensioned to match the characteristic impedance of the waveguide to the impedance at the mixer diode site;

(2) said first and second metallizations in said fifth region between said second opening and said fourth region provide a non-coplanar tapered slot for coupling to said E field and rotating the Y axis oriented E field to an X axis orientation, said pattered metallizations being tapered to match the characteristic impedance of the waveguide to an impedance value comparable to the impedance at the mixer diode site;

(3) said first and second metallizations in said fourth region form, respectively, the top and ground plane conductors of a microstrip line with an X axis oriented E field and further provide:

(i) a hgih pass filter for passing local oscillator waves toward said mixer diode site but blocking intermediate frequency waves from said second opening, and (ii) a tap disposed between said mixer diode site and said high pass filter, for deriving waves at the intermediate frequency, (4) said first metallization in said third region consists of at least two conductor portions spaced from said top conductor of said microstrip line to form two coplanar slots with said top conductor at the center, said ground plane conductor continues from said fourth region, through said third region and terminates at the boundary between said third region and second region, for rotating the X axis oriented E field from said microstrip line in clockwise and counter clockwise directions to form two substantially equal Y axis oriented E field components, both or like sense in relation to said top conductor of said microstrip line, (5) the first metallization in said second region forms a "T" junction slot coupled to the planar tapered slot of the first region that branches into two coplanar slots with said top conductor of said microstrip line at the center, said two coplanar slots continuing into an orientation parallel to said Z axis, each of said mixer diodes being sited across one branch of said "T" junction and poled for alternate conduction in successive half cycles of the local oscillator waves and poled for simultaneous conduction in alternating half cycles of the signal waves, and said two coplanar slots conduct intermediate frequency waves arising in said mixer diodes via said microstrip line to said tap for coupling to said third opening.

2. A mixer comprising:

A. a pair of mixer diodes,

B. a member housing said mixer diodes, and providing a rectangular waveguide chamber suitable for propagating a wave in a TE 10 mode and having an axis extending in the Z dimension, the E field of said TE 10 mode having a Y axis orientation, parallel to the shorter waveguide dimension, the X axis being parallel to the longer waveguide dimension and transverse to the Y and Z axis, said waveguide having (1) a first opening at one end for coupling to a signal waveguide supplying signal waves to said mixer, (2) a second opening at the other end for coupling to an oscillator waveguide supplying local oscillator waves to said mixer, and (3) a third opening in a lateral wall for said member, for coupling the mixer output to an intermediate frequency amplifier, C. a dielectric substrate, providing a site for said mixer diodes, said substrate lying substantially in the Y Z plane of said waveguide and having a first patterned metallization on one surface thereof and a second patterned metallization on the opposite surface thereof, said metallizations successively providing firsts, second, third, fourth, and fifth consecutive regions for transforming said signal waves and LO waves for efficient signal conversion, and comprising (1) means in said first region for transforming the impedance of said signal waveguide to a first low impedance comparable to that required for mixer operation with the E field remaining parallel to said substrate, (2) means in said fifth region for transforming the impedance of said oscillator waveguide to a second low impedance comparable to that required for mixer operation and for rotating the E field into perpendicularly to said substrate, (3) means in said fourth region for high pass filtering LO waves from said fifth region int he path toward said diode site and blocking IF and DC in said LO path, and for low pass filtering waves of intermediate frequency in a path from said didoe site to the mixer output via said third opening, but blocking LO waves and signal waves in said IF path, (4) means in said third region for splitting said local oscillator waves in two equal parts for coupling to said diodes and rotating the parts clockwise and counterclockwise until the E fileds thereof are parallel to said substrate at said diode site and couple with opposite polarities to each of said diodes, and (5) means in said second region for splitting said signal waves in two equal parts coupled with the same polarity to each of said diodes at said diode site.

3. The mixer set forth in claim 2 wherein said housing is formed of two mmebers, at least one of which is recessed to allow insertion of said substrate, said members when joined forming an enclousre between the ends of said housing having low RF leakage.

4. The mixer as set forth in claim 3 wherein two rectangular choke chambers are provided, each having an axis extending in the Z dimension, parallel to said waveguide chamber in the plus or minus Y direction, said choke chambers also being approximately a quarter wavelength in the Y dimension, whereby RF leakage into said choke chambers and in turn through said housing is minimized.

5. The mixer as set forth in claim 4 wherein said substrate extends into said choke chambers and wherein the metallization providing said filtered path between said microstrip line in said fourth region and the mixer output via said third opening passes through an opening from said waveguide chamber into said choke chamber, passes along said choke chamber, and emerges from said choke chamber via said third opening.

6. The mixer as set forth in claim 2 wherein said means in said first region for transforming the impedance of said signal waveguide is a tapered slot formed by patterning said first metallization.

7. The mixer as set forth in claim 6 wherein said means in said fifth region for transforming the impedance of said oscillator waveguide and rotating the E field is a non-coplanar tapered slot formed by patterning said first and second metallizations.

8. The mixer as set forth in claim 7 wherein said means in said fourth region for high pass filtering LO wave, blocking IF and DC in the LO path, and low pass filtering waves of intermediate frequency comprises a microstrip line in which said first metallization forms a top conductor and said second metallization forms a wide conductor that acts as a ground plane.

9. The mixer set forth in claim 7 wherein said local oscillator waves and signal waves are close in frequency to produce a low intermediate frequency, said splitting means in said second region and in said third region are interconnected by two paths that form a bridge in which local oscillator waves coupled to said fourth region are substantially cancelled in passage to said first region and signal waves coupled to said first region are substantially cancelled in passage to said fourth region.

10. The mixer set forth in claim 9 wherein the two paths between said splitting means are of equal electrical length and said splitting means in said third regions provides an inversion of the sense of the signal in one path in relation to the signal in the other path to effect said cancellations.

11. The mixer set forth in claim 10 wherein said third region is provided with at least one pair of matching stubs for matching the impedance of said fourth region to the impedance of said second region.

12. The mixer set forth in claim 10 wherein said splitting means in said second region and said diode site are at substantially the same electrical position, and wherein two pairs of matching stubs are provided, one pair being adjacent to said second region and having slots for decoupling from the first patterned metallization of said second region, the electrical length between said slots and said diode site being substantially 180 electrical degrees for matching and tuning the signal across said mixer diodes for improved conversion efficiency.

* * * * *

UNITED STATES PATENT AND TRADEMARK OFFICE
CERTIFICATE OF CORRECTION

PATENT NO. : 4,661,997

DATED : April 28, 1987

INVENTOR(S) : Clayton R. Roberts, Et Al.

It is certified that error appears in the above-identified patent and that said Letters Patent is hereby corrected as shown below:

Column 7, line 7, the word "thicknesss" should be --thickness--.

Column 11, line 22, remove the comma after "waves".

Column 12, line 39, insert --an-- after "having".

Column 12, line 61, the word "region" should be --regions--.

Column 13, line 6, change the word "pattered" to --patterned--.

Column 13, line 15, the word "hgih" should be --high--.

Column 13, line 33, change the word "or" to --of--.

Column 14, line 10, change the word "firsts" to --first--.

Column 14, line 23, change the word "perpendicularly" to --perpendicularity--.

Column 14, line 25, change the words "int he" to --in the--.

Column 14, line 29, change the word "didoe" to --diode--.

Column 14, line 35, change the word "fileds" to --fields--.

Column 14, line 44, change the word "mmebers" to --members--.

Column 14, line 47, change the word "enclousre" to --enclosure--.

UNITED STATES PATENT AND TRADEMARK OFFICE
CERTIFICATE OF CORRECTION

PATENT NO. : 4,661,997
DATED : April 28, 1987
INVENTOR(S) : Clayton R. Roberts, et al Page 2 of 2

It is certified that error appears in the above-identified patent and that said Letters Patent is hereby corrected as shown below:

Column 16, line 6, change the word "regions" to
-- region--

Signed and Sealed this

First Day of September, 1987

*Attest:*

DONALD J. QUIGG

*Attesting Officer*     Commissioner of Patents and Trademarks